United States Patent
Kobayashi et al.

(10) Patent No.: US 8,729,771 B2
(45) Date of Patent: May 20, 2014

(54) COMPOSITE SUBSTRATE MANUFACTURING METHOD AND COMPOSITE SUBSTRATE

(75) Inventors: Hiroki Kobayashi, Chiryu (JP); Takanori Sakurai, Kitanagoya (JP); Yuji Hori, Nagoya (JP); Yasunori Iwasaki, Kitanagoya (JP)

(73) Assignee: NGK Insulators, Ltd., Aichi-prefecture (JP)

( * ) Notice: Subject to any disclaimer, the term of this patent is extended or adjusted under 35 U.S.C. 154(b) by 289 days.

(21) Appl. No.: 13/253,156

(22) Filed: Oct. 5, 2011

(65) Prior Publication Data

US 2012/0086312 A1 Apr. 12, 2012

Related U.S. Application Data

(60) Provisional application No. 61/390,240, filed on Oct. 6, 2010.

(51) Int. Cl.
*H03H 9/05* (2006.01)
*H03H 9/02* (2006.01)

(52) U.S. Cl.
CPC ......... H03H 9/0585 (2013.01); H03H 9/02622 (2013.01)
USPC ...................................... 310/313 R

(58) Field of Classification Search
CPC .................. H03H 9/02622; H03H 9/0585
USPC ....... 310/313 R, 313 A, 313 B, 313 C, 313 D
See application file for complete search history.

(56) References Cited

U.S. PATENT DOCUMENTS

2004/0226162 A1 * 11/2004 Miura et al. .................... 29/594
2007/0120623 A1   5/2007 Sakiyama et al.

FOREIGN PATENT DOCUMENTS

| DE | 10 2009 001 192 A1 | 10/2009 | |
| JP | 05-000511 | * 1/1993 | ................ B41J 2/16 |
| JP | 2001-053579 A | 2/2001 | |

OTHER PUBLICATIONS

Machine translation of JP05-000511, Jan. 1993.*
Office Action from German Patent App. No. 10 2011 084 045.1 (Aug. 6, 2013) with English translation thereof.

* cited by examiner

*Primary Examiner* — Derek Rosenau
(74) *Attorney, Agent, or Firm* — Cermak Nakajima LLP; Tomoko Nakajima

(57) ABSTRACT

According to a composite substrate manufacturing method of the present invention, (a) a piezoelectric substrate having minute asperities formed in a rear surface thereof, and a support substrate having a smaller thermal expansion coefficient than the piezoelectric substrate are prepared, (b) a filler is applied to the rear surface 11a to fill the minute asperities, thereby forming a filling layer, (c) a surface of the filling layer is mirror-polished to such an extent that an arithmetic mean roughness Ra of the surface of the filling layer is smaller than an arithmetic mean roughness Ra of the rear surface 11a in a state of above (a), and (d) the surface of the filling layer and a surface of the support substrate are bonded to each other with an adhesive layer interposed therebetween, thereby forming a composite substrate.

7 Claims, 3 Drawing Sheets

COMPOSITE SUBSTRATE MANUFACTURING METHOD AND COMPOSITE SUBSTRATE

This application claims priority under 35 U.S.C. §119(e) to U.S. Provisional Patent Application No. 61/390,240, filed Oct. 6, 2010, the entirety of which is incorporated by reference herein.

BACKGROUND OF THE INVENTION

1. Field of the Invention

The present invention relates to a composite substrate manufacturing method and a composite substrate.

2. Description of the Related Art

Hitherto, a surface acoustic wave device is known which employs a composite substrate including a support substrate and a piezoelectric substrate bonded to each other, and which has comb-shaped electrodes formed on the surface of the piezoelectric substrate and being capable of exciting surface acoustic waves. By bonding, to the piezoelectric substrate, the support substrate having a smaller thermal expansion coefficient than the piezoelectric substrate, changes in dimensions of the piezoelectric substrate depending on temperature changes are suppressed, and changes in a frequency characteristic when used as the surface acoustic wave device are also suppressed. For example, a surface acoustic wave device disclosed in Patent Document 1 has a structure that a piezoelectric substrate and a support substrate are bonded to each other by using an adhesive layer. In the disclosed surface acoustic wave device, the occurrence of the spurious is suppressed by forming minute asperities on a surface (rear surface) of the piezoelectric substrate at which the piezoelectric substrate is bonded to the support substrate. More specifically, bulk waves are generated as one type of acoustic waves along with the surface acoustic waves near the comb-shaped electrodes and then reach the rear surface of the piezoelectric substrate. However, the bulk waves are scattered by the asperities formed in the rear surface. Thus, the bulk waves are avoided from reaching the comb-shaped electrodes after being reflected at the rear surface of the piezoelectric substrate, whereby the occurrence of the spurious is suppressed.

CITATION LIST

Patent Document

[Patent Document 1] Japanese Unexamined Patent Application Publication No. 2001-53579

SUMMARY OF THE INVENTION

In the surface acoustic wave device disclosed in Patent Document 1, however, because the asperities are formed in the rear surface of the piezoelectric substrate, air may be entrapped when the piezoelectric substrate and the support substrate are bonded to each other, thus causing bubbles to generate inside the composite substrate in some cases. For example, when an adhesive is applied to only the rear surface of the piezoelectric substrate and the piezoelectric substrate is bonded to the support substrate with an adhesive layer interposed therebetween, the influence of the asperities formed in the rear surface of the piezoelectric substrate appears at the adhesive surface, and hence bubbles may be generated at the boundary between the adhesive layer and the support substrate. Also, when an adhesive is applied to both the rear surface of the piezoelectric substrate and a (front) surface of the support substrate, the influence of the asperities formed in the rear surface of the piezoelectric substrate similarly appears at surface of the adhesive on the piezoelectric substrate side. Therefore, air may enter between the adhesive surfaces when both the adhesives are joined together, and bubbles may be generated inside the adhesive layer.

The present invention has been accomplished in view of the problems described above, and a main object of the present invention is to prevent bubbles from being generated inside a composite substrate including a piezoelectric substrate and a support substrate, which are bonded to each other with an adhesive layer interposed therebetween.

To achieve the above object, the present invention is constituted as follows.

In the present invention, a composite substrate manufacturing method includes the steps of: (a) preparing a piezoelectric substrate having minute asperities formed in one surface thereof, and a support substrate having a smaller thermal expansion coefficient than the piezoelectric substrate; (b) applying a filler to the one surface to fill the minute asperities, thereby forming a filling layer; (c) mirror-polishing a surface of the filling layer to such an extent that an arithmetic mean roughness Ra of the surface of the filling layer is smaller than an arithmetic mean roughness Ra of the one surface in the step (a); and (d) bonding the surface of the filling layer and a surface of the support substrate to each other with an adhesive layer interposed therebetween, thereby forming a composite substrate.

The composite substrate manufacturing method of the present invention can prevent bubbles from being generated inside the composite substrate, specifically at the boundary between the adhesive layer and the filling layer, inside the adhesive layer, and at the boundary between the adhesive layer and the support substrate. In more detail, when the bonding is performed by applying the adhesive to only the one surface of the piezoelectric substrate, the adhesive is applied to a flat surface of the filling layer that is formed on the one surface of the piezoelectric substrate. As a result, the influence of the asperities in the one surface of the piezoelectric substrate does not appear at the adhesive surface, and bubbles can be prevented from being generated at the boundary between the filling layer and the adhesive layer and the boundary between the adhesive layer and the support substrate. Also, when the bonding is performed by applying the adhesive to both the one surface of the piezoelectric substrate and the surface of the support substrate, the influence of the asperities in the one surface of the piezoelectric substrate does not appear at the adhesive surface for the same reason as that described above. Therefore, air is less apt to be entrapped when the adhesives on both the surfaces are joined together, and bubbles can be prevented from being generated inside the adhesive layer.

In the composite substrate manufacturing method of the present invention, in the step (c), the surface of the filling layer may be mirror-polished by using slurry which exhibits a lower polishing rate for the piezoelectric substrate than that for the filling layer. In other words, in the step (c), the surface of the filling layer may be mirror-polished by using slurry, and the polishing rate of the slurry for the piezoelectric substrate may be lower than the polishing rate of the slurry for the filling layer. With such a feature, when the surface of the filling layer is mirror-polished, the polishing rate is reduced after the one surface of the piezoelectric substrate has been partly exposed at the surface of the filling layer. Therefore, the arithmetic mean roughness Ra of the one surface of the piezoelectric substrate is less apt to reduce in its value when the mirror-polishing is continued even after the one surface of the piezoelectric substrate has been partly exposed.

In the composite substrate manufacturing method of the present invention, in the step (c), the mirror-polishing may be performed until the one surface of the piezoelectric substrate is partly exposed. With such a feature, a thickness of the filling layer can be reduced, and hence a total thickness of the filling layer and the adhesive layer can also be reduced. The effect of the support substrate in suppressing changes in dimensions of the piezoelectric substrate depending on temperature changes is less apt to develop if the total thickness of the filling layer and the adhesive layer is too large. However, the above-mentioned effect can be sufficiently obtained with the manufacturing method of the present invention because the total thickness can be reduced.

In the composite substrate manufacturing method of the present invention, in the step (d), the bonding may be performed with interposition of an adhesive layer, which is made of the same material as that of the filling layer formed in the step (b). This feature eliminates the need of preparing different materials for the filling layer and the adhesive layer.

In the composite substrate manufacturing method of the present invention, the total thickness of the filling layer and the adhesive layer after the bonding in the step (d) may be 0.1 µm or more and 1.0 µm or less. This feature enables the support substrate to sufficiently develop the effect of suppressing changes in the dimensions of the piezoelectric substrate depending on temperature changes.

A composite substrate of the present invention includes: a piezoelectric substrate having minute asperities formed in one surface thereof; a support substrate having a smaller thermal expansion coefficient than the piezoelectric substrate; a filling layer formed to fill the minute asperities and having a joined surface on the side oppositely away from the piezoelectric substrate, the joined surface having an arithmetic mean roughness Ra smaller than an arithmetic mean roughness Ra of the one surface of the piezoelectric substrate; and an adhesive layer bonding the joined surface and the support substrate to each other, wherein no bubbles are present at a boundary between the adhesive layer and the filling layer, inside the adhesive layer, and at a boundary between the adhesive layer and the support substrate.

The composite substrate of the present invention can be obtained with the above-described composite substrate manufacturing method of the present invention. In the composite substrate of the present invention, since no bubbles are present at the boundary between the adhesive layer and the filling layer, inside the adhesive layer, and at the boundary between the adhesive layer and the support substrate, an adhesion force between the piezoelectric substrate and the support substrate can be increased in comparison with that in a composite substrate in which the piezoelectric substrate and the support substrate are bonded to each other with the adhesive layer interposed therebetween without forming the filling layer. Herein, the expression "no bubbles are present" means that no bubbles are found when observing a cross-section of the composite substrate, cut in the stacking direction thereof, at a magnification of 10000. Herein, the expression "a filling layer formed to fill the minute asperities and having a joined surface on the side oppositely away from the piezoelectric substrate, the joined surface having an arithmetic mean roughness Ra smaller than the one surface of the piezoelectric substrate" means that a filling layer which is formed to fill the minute asperities and has a joined surface on the side oppositely away from the piezoelectric substrate, and an arithmetic mean roughness Ra of the joined surface is smaller than an arithmetic mean roughness Ra of the one surface of the piezoelectric substrate.

In the composite substrate of the present invention, the one surface of the piezoelectric substrate may be exposed at the joined surface. With such a feature, the thickness of the filling layer is reduced in comparison with that in a composite substrate in which the one surface of the piezoelectric substrate is not exposed at the joined surface. Namely, the total thickness of the filling layer and the adhesive layer is reduced. The effect of the support substrate in suppressing changes in the dimensions of the piezoelectric substrate depending on temperature changes is less apt to develop if the total thickness of the filling layer and the adhesive layer is too large. However, the above-mentioned effect can be sufficiently obtained with the composite substrate of the present invention because the total thickness can be reduced.

In the composite substrate of the present invention, the adhesive layer may be made of the same material as that of the filling layer. This feature eliminates the need of preparing different materials for the filling layer and the adhesive layer and forming those layers with the different materials.

In the composite substrate of the present invention, the total thickness of the filling layer and the adhesive layer may be 0.1 µm or more and 1.0 µm or less. This feature enables the support substrate to sufficiently develop the effect of suppressing changes in the dimensions of the piezoelectric substrate depending on temperature changes.

DESCRIPTION OF THE PREFERRED EMBODIMENTS

Figure 1:
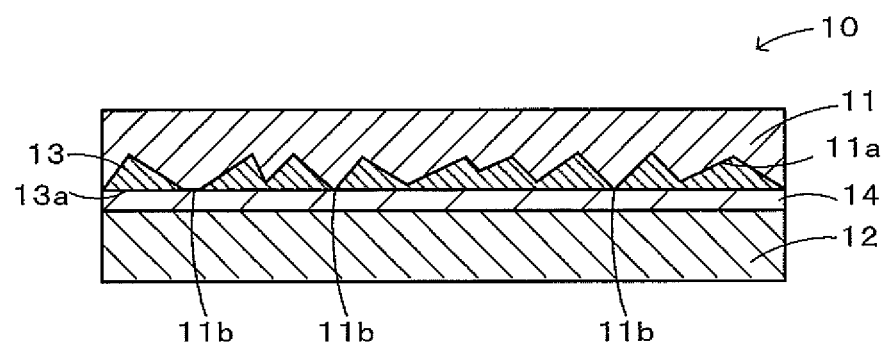
FIG. 1 is a sectional view of a composite substrate 10 of the present invention.

An embodiment of the present invention will be described below with reference to the drawings. FIG. 1 is a schematic sectional view of a composite substrate 10 of this embodiment. The composite substrate 10 includes a piezoelectric substrate 11, a support substrate 12, a filling layer 13 formed on a rear surface 11a of the piezoelectric substrate 11, and an adhesive layer 14 for bonding a surface 13a of the filling layer 13 and a (front) surface of the support substrate 12 to each other. The composite substrate 10 of this embodiment is used as a surface acoustic wave device by providing comb-shaped electrodes on a front surface of the piezoelectric substrate 11.

The piezoelectric substrate 11 allows propagation of surface acoustic waves therethrough. Materials of the piezoelectric substrate 11 are, for example, lithium tantalate, lithium niobate, and a single crystal of lithium niobate-lithium tantalate solid solution. Dimensions of the piezoelectric substrate 11 are, though not limited to particular ones, e.g., 50 to 150 mm in diameter and 10 to 50 µm in thickness. Minute asperities are formed in the rear surface 11a of the piezoelectric substrate 11, and an arithmetic mean roughness Ra of the rear surface 11a is, e.g., 0.1 µm. The arithmetic mean roughness Ra of the rear surface 11a of the piezoelectric substrate 11 is not limited to such a value as long as it is set to a value capable of scattering bulk waves and suppressing the occurrence of the spurious when the composite substrate 10 is used as a surface acoustic wave device. For example, the arithmetic mean roughness Ra may be set to a value comparable to the wavelength of surface acoustic waves used.

The support substrate 12 is bonded to the piezoelectric substrate 11 with the filling layer 13 and the adhesive layer 14 interposed therebetween. The support substrate 12 has a smaller thermal expansion coefficient than the piezoelectric substrate 11. By setting the thermal expansion coefficient of the support substrate 12 to be smaller than that of the piezoelectric substrate 11, changes in the dimensions of the piezoelectric substrate 11 depending on temperature changes can be suppressed, and temperature-dependent changes in a frequency characteristic can also be suppressed when the composite substrate 10 is used as a surface acoustic wave device. Materials of the support substrate 12 are, for example, silicon, sapphire, aluminum nitride, alumina, borosilicate glass, and quartz glass. Dimensions of the support substrate 12 are, though not limited to particular ones, e.g., 50 to 150 mm in diameter and 100 to 500 μm in thickness.

The filling layer 13 is a layer formed to fill the minute asperities in the rear surface 11a of the piezoelectric substrate 11. A surface 13a of the filling layer 13 on the side oppositely away from the piezoelectric substrate 11 is joined to the adhesive layer 14. The surface 13a has a smaller arithmetic mean roughness Ra than the rear surface 11a of the piezoelectric substrate 11. The arithmetic mean roughness Ra of the surface 13a is, though not limited to particular one, e.g., 3 nm to 7 nm. Further, the rear surface 11a of the piezoelectric substrate 11 is partly exposed at the surface 13a. Stated another way, crest portions 11b of the asperities in the rear surface 11a of the piezoelectric substrate 11 are substantially aligned with the surface 13a. Materials of the filling layer 13 are, though not limited to particular ones, preferably organic adhesives having heat resistance, such as an epoxy-based adhesive and an acrylic adhesive, for example. Further, a filler serving as the filling layer 13 is preferably selected such that the Young's modulus after being hardened is in the range of 2 to 90 GPa. When the Young's modulus is in that range, the filling layer 13 exhibits an effect of suppressing bulk waves, and hence an effect of suppressing the spurious is increased when the composite substrate 10 is used as a surface acoustic wave device.

The adhesive layer 14 serves to bond the surface 13a of the filling layer 13 and the surface of the support substrate 12 to each other. As with the materials of the filling layer 13, materials of the adhesive layer 14 are, though not limited to particular ones, preferably organic adhesives having heat resistance, such as an epoxy-based adhesive and an acrylic adhesive, for example. The material of the adhesive layer 14 and the material of the filling layer 13 may be the same or may differ from each other. When the adhesive layer 14 and the filling layer 13 are made of the same material, there is no need of forming the filling layer 13 and the adhesive layer 14 by using different materials.

A total thickness of the adhesive layer 14 and the filling layer 13 is, though not limited to particular one, preferably, e.g., 0.1 μm or more and 1.0 μm or less. When the total thickness of the adhesive layer 14 and the filling layer 13 is set to be 1.0 μm or less, the above-mentioned effect of the support substrate 12 of suppressing changes in the dimensions of the piezoelectric substrate 11 depending on temperature changes can be obtained at a sufficient level. The total thickness of the adhesive layer 14 and the filling layer 13 may be defined as a distance from the crest portions 11b of the asperities in the rear surface 11a of the piezoelectric substrate 11 to the support substrate 12. Bubbles are not present at the boundary between the adhesive layer 14 and the filling layer 13, inside the adhesive layer 14, and at the boundary between the adhesive layer 14 and the support substrate 12. In other words, no bubbles are found anywhere when a cross-section prepared by cutting the composite substrate 10 in the stacking direction is observed at a magnification of 10000. Thus, an adhesion force between the piezoelectric substrate 11 and the support substrate 12 is increased in comparison with that obtained when bubbles are present.

Figure 2:
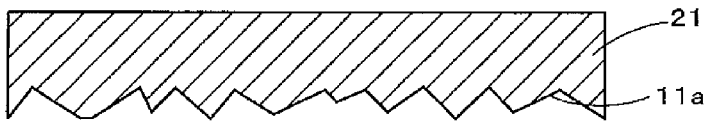
FIG. 2 is a schematic sectional view illustrating a manufacturing process for the composite substrate 10 of the present invention.
Figure 2:
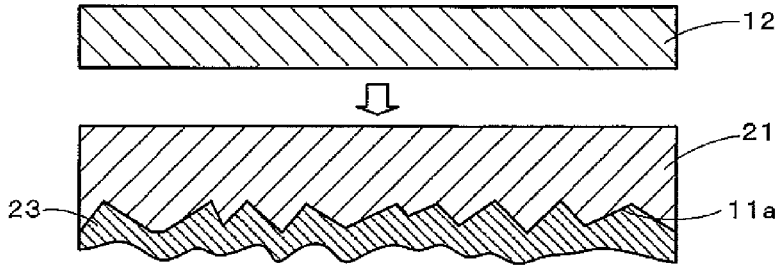
Figure 2:
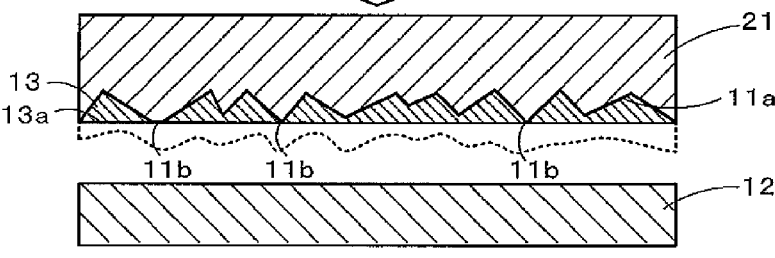
Figure 2:
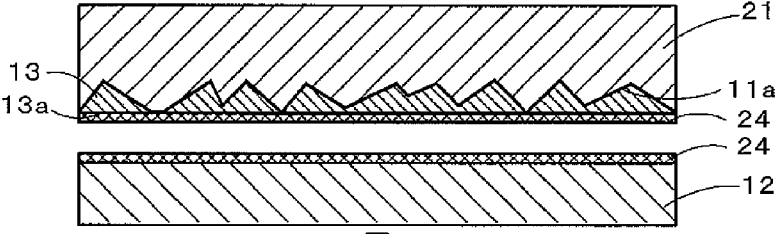
Figure 2:
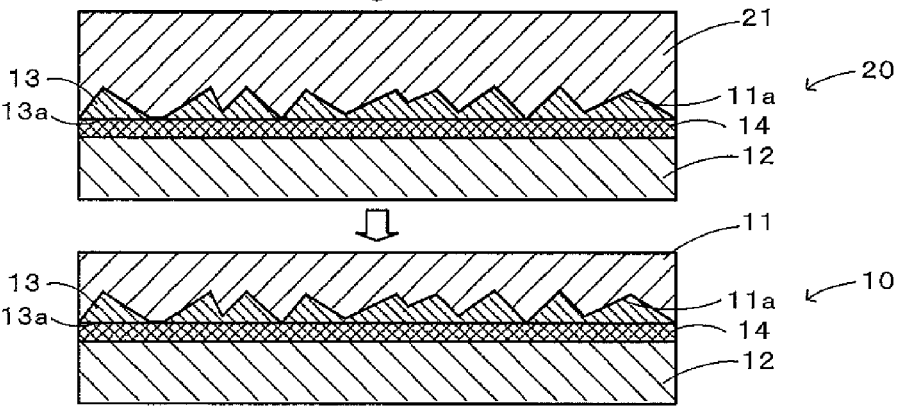

A method of manufacturing the composite substrate 10 will be described below with reference to FIG. 2. FIG. 2 is a schematic sectional view illustrating a manufacturing process for the composite substrate 10. The method of manufacturing the composite substrate 10 includes steps of (a) preparing a piezoelectric substrate 21 having minute asperities formed in a rear surface 11a thereof, and the support substrate 12 having a smaller thermal expansion coefficient than the piezoelectric substrate 21, (b) applying a filler to the rear surface 11a to fill the minute asperities, thereby forming a filling layer 23, (c) mirror-polishing a surface of the filling layer 23 to such an extent that an arithmetic mean roughness Ra of the surface of the filling layer 23 is smaller than an arithmetic mean roughness Ra of the rear surface 11a in the step (a), and (d) bonding the surface 13a of the filling layer 13 and a surface of the support substrate 12 to each other with the adhesive layer 14 interposed therebetween, thereby forming a composite substrate 20.

In the step (a), the piezoelectric substrate 21, which becomes the piezoelectric substrate 11 later, and the support substrate 12 are prepared (FIG. 2(a)). The piezoelectric substrate 21 and the support substrate 12 can be made of materials selected from the above-mentioned examples. Dimensions of the piezoelectric substrate 21 may be, though not limited to particular ones, e.g., 50 to 150 mm in diameter and 150 to 500 μm in thickness. Dimensions of the support substrate 12 may be, though not limited to particular ones, e.g., 50 to 150 mm in diameter and 100 to 500 μm in thickness. The thickness of the piezoelectric substrate 21 and the support substrate 12 may be 250 to 500 μm. The rear surface 11a of the piezoelectric substrate 21 is previously roughed by using a lapping machine or by sand blasting such that its arithmetic mean roughness Ra takes a predetermined value (0.1 μm in this embodiment).

In the step (b), the filler is applied to fill the minute asperities in the rear surface 11a of the piezoelectric substrate 21 and is hardened, thereby forming the filling layer 23 (FIG. 2(b)). The filler can be made of a material selected from the above-mentioned examples. The filler can be applied by, e.g., spin coating.

In the step (c), the surface of the filling layer 23 is mirror-polished to such an extent that the arithmetic mean roughness Ra of the surface of the filling layer 23 is smaller than the arithmetic mean roughness Ra of the rear surface 11a in the step (a) (FIG. 2(c)). The mirror-polishing can be performed, for example, with CMP (Chemical Mechanical Polishing) using slurry. The mirror-polishing is carried out until the crest portions 11b of the asperities in the rear surface 11a of the piezoelectric substrate 21 are exposed at the surface 13a of the filling layer 23. Whether the crest portions 11b of the piezoelectric substrate 21 are exposed or not can be determined, for example, by observing the surface 13a of the filling layer 23 whenever the surface 13a has been polished for a certain time. A polishing time necessary for making the crest portions 11b of the piezoelectric substrate 21 exposed is determined depending on the amount of the filler applied and the arithmetic mean roughness Ra of the rear surface 11a of the piezoelectric substrate 21. Therefore, the rear surface 11a of the piezoelectric substrate 21 can also be made exposed by performing the polishing for the polishing time that has been previously determined based on experiments. The slurry used in the mirror-polishing is selected such that it exhibits a lower polishing rate for the piezoelectric substrate 21 than that for the filling layer 23. By using that type of slurry, during the mirror-polishing of the surface of the filling layer 23, the polishing rate is reduced after the rear surface 11a of the piezoelectric substrate 21 has been partly exposed at the surface of the filling layer 23. Accordingly, when the mirror-polishing is continued even after the rear surface 11a of the piezoelectric substrate 11 has been exposed, the arithmetic mean roughness Ra of the rear surface 11a of the piezoelectric substrate 21 is less apt to reduce in its value. Through the step (c), the filling layer 23 becomes the filling layer 13 illustrated in FIG. 1.

In the step (d), the surface 13a of the filling layer 13 and the surface of the support substrate 12 are bonded to each other with the adhesive layer interposed therebetween, thereby forming the composite substrate 20. For example, the composite substrate 20 is formed by uniformly applying an adhesive 24 to each of the surface 13a of the filling layer 13 and the surface of the support substrate 12, and hardening the adhesive 24 to form the adhesive layer 14 in the state where both the surfaces are bonded to each other (FIG. 2(d)). The adhesive can be made of a material selected from the above-mentioned examples. The material of the adhesive may be the same as or may differ from that of the filler used in the step (b). When the adhesive and the filler are made of the same material, there is no need of preparing different materials for the adhesive and the filler. The adhesive can be applied by, e.g., spin coating. The adhesive is preferably applied such that the total thickness of the adhesive layer 14 in the hardened state and the filling layer 13 is, as described above, 0.1 μm or more and 1.0 μm or less. Alternatively, the surface 13a of the filling layer 13 and the surface of the support substrate 12 may be bonded to each other after applying the adhesive to one of both the surfaces.

After the formation of the composite substrate 20, a front surface (upper surface) of the piezoelectric substrate 21 is ground to reduce the thickness thereof and is further mirror-polished in step (e) (FIG. 2(e)). As a result, the piezoelectric substrate 21 becomes the piezoelectric substrate 11 illustrated in FIG. 1, and the composite substrate 10 is obtained.

If the adhesive is applied to only the rear surface 11a of the piezoelectric substrate 21 and the piezoelectric substrate 21 is bonded to the support substrate 12 with the adhesive layer 14 interposed therebetween without performing the above-described steps (b) and (c), bubbles may be generated at the boundary between the adhesive layer 14 and the support substrate 12 due to the presence of the minute asperities in the rear surface 11a of the piezoelectric substrate 21. Also, if the adhesive is applied to both the rear surface 11a of the piezoelectric substrate 21 and the surface of the support substrate 12, air may be entrapped when the adhesives on both the surfaces are joined together and bubbles may be generated inside the adhesive layer 14 because the influence of the asperities in the rear surface 11a appears at the surface of the adhesive on the piezoelectric substrate 21. In contrast, the composite substrate manufacturing method of this embodiment can prevent bubbles from being generated at the boundary between the adhesive layer 14 and the filling layer 13, inside the adhesive layer 14, and at the boundary between the adhesive layer 14 and the support substrate 12. More specifically, according to this embodiment, the minute asperities in the piezoelectric substrate 21 are flattened by the filling layer 13. Therefore, when the adhesive is applied to only the rear surface 11a of the piezoelectric substrate 21, the adhesive is applied to the flat surface of the filling layer 13, and hence bubbles can be prevented from being generated at the boundary between the adhesive layer 14 and the filling layer 13 and at the boundary between the adhesive layer 14 and the support substrate 12. Also, when the adhesive is applied to both the rear surface 11a of the piezoelectric substrate 21 and the surface of the support substrate 12, air is less apt to be entrapped when the adhesives on both the surfaces are joined together, and bubbles can be prevented from being generated inside the adhesive layer 14 for the reason that the influence of the asperities in the rear surface 11a does not appear at the surface of the adhesive on the piezoelectric substrate 21.

Thus, the above-described method of manufacturing the composite substrate 10 according to this embodiment can more surely prevent bubbles from being generated inside the composite substrate 10, specifically at the boundary between the adhesive layer 14 and the filling layer 13, inside the adhesive layer 14, and at the boundary between the adhesive layer 14 and the support substrate 12, in comparison with the case where the piezoelectric substrate 21 and the support substrate 12 are bonded to each other with the adhesive layer 14 interposed therebetween without forming the filling layer 13. As a result, the composite substrate 10 can be obtained which has a higher adhesion force between the piezoelectric substrate 11 and the support substrate 12 in comparison with a composite substrate obtained by bonding the piezoelectric substrate 11 and the support substrate 12 to each other with the adhesive layer interposed therebetween without forming the filling layer 13.

Since, in the step (c), the surface of the filling layer 23 is mirror-polished by using the slurry which exhibits a lower polishing rate for the piezoelectric substrate 21 than that for the filling layer 23, the arithmetic mean roughness Ra of the rear surface 11a of the piezoelectric substrate 21 is less apt to reduce in its value when the mirror-polishing is continued even after the rear surface 11a of the piezoelectric substrate 21 has been partly exposed at the surface of the filling layer 23.

Further, since in the step (c) the mirror-polishing is performed until the rear surface 11a of the piezoelectric substrate 21 is partly exposed, the thickness of the filling layer 13 can be reduced, and hence the total thickness of the filling layer 13 and the adhesive layer 14 can also be reduced. This enables the support substrate 12 to sufficiently develop the effect of suppressing changes in the dimensions of the piezoelectric substrate 11 depending on temperature changes.

Since the total thickness of the filling layer 13 and the adhesive layer 14 after the bonding in the step (d) is set to be 0.1 μm or more and 1.0 μm or less, the support substrate 12 can sufficiently exhibit the effect of suppressing changes in the dimensions of the piezoelectric substrate 11 depending on temperature changes.

The present invention is not limited to the above-described embodiment. It is clear that the present invention can be implemented in a variety of embodiments without departing from the technical scope thereof.

EXAMPLES

Example 1

As EXAMPLE 1, the composite substrate 10 illustrated in FIG. 1 was fabricated by the manufacturing method described above with reference to FIG. 2, and a surface acoustic wave device was fabricated using the composite substrate 10. First, in the step (a), a lithium tantalate substrate (LT substrate) including an orientation flat (OF) portion and having a diameter of 4 inches and a thickness of 250 μm was prepared as the piezoelectric substrate 21. Also, a silicon substrate including an OF portion and having a diameter of 4 inches and a thickness of 230 μm was prepared as the support substrate 12. The LT substrate was provided as a 46° Y-cut X-propagation LT substrate with the propagation direction of surface acoustic waves (SAW) being X and the cut angle being set to provide a 46° rotated Y-cut plate. A rear surface of the LT substrate was roughed by a lapping machine to have an arithmetic mean roughness Ra of 0.1 μm. A (front) surface of the silicon substrate was mirror-polished to have an arithmetic mean roughness Ra of 10 nm.

Next, in the step (b), a filler was uniformly applied by using a spin coater to fill the minute asperities in the rear surface of the LT substrate. The filler was prepared as an epoxy-based ultraviolet-curable resin having the Yung's modulus of 5 GPa after being cured. The applied filler was cured with irradiation of an ultraviolet ray of 2000 mJ, whereby a filling layer having a mean thickness of 5 μm was formed. At that time, a surface of the filling layer had an arithmetic mean roughness Ra of 38 nm.

Next, in the step (c), the surface of the cured filling layer was polished by CMP. In the CMP, colloidal alumina was used as the slurry. A ratio in polishing rate between the LT substrate and the filling layer 13 was about 1:80 with the use of colloidal alumina. The CMP was performed until the rear surface of the LT substrate was exposed. Whether the rear surface of the LT substrate was exposed or not was determined by observing the surface of the filling layer at intervals of a certain time. The arithmetic mean roughness Ra of the surface of the filling layer after the CMP was 3 to 7 nm.

In the step (d), an adhesive was uniformly applied in a thickness of 4000 Å on each of the surface of the filling layer and the surface of the silicon substrate by using a spin coater. The adhesive was made of the same material as that of the filler. The adhesive-coated surface of the filling layer and the adhesive-coated surface of the silicon substrate were bonded to each other, and a composite substrate was obtained by curing the adhesive with irradiation of an ultraviolet ray of 2000 mJ from the LT substrate side. An adhesive layer after being cured had a thickness of 0.8 μm.

In the step (e), the front surface of the LT substrate in the composite substrate was ground and polished such that the thickness of the LT substrate was reduced to 40 μm from an initial value of 250 μm. Thus, the composite substrate 10 illustrated in FIG. 1 was obtained.

As a result of cutting the fabricated composite substrate of EXAMPLE 1 in the stacking direction of the composite substrate and observing its cross-section at a magnification of 10000, no bubbles were found in the filling layer 13 and the adhesive layer 14.

Example 2

As EXAMPLE 2, the composite substrate 10 was fabricated in a similar manner to that in EXAMPLE 1 except for using an epoxy-based ultraviolet curable resin, which differs in type from that of the filler, as the adhesive in the step (d).

As a result of cutting the fabricated composite substrate of EXAMPLE 2 in the stacking direction of the composite substrate and observing its cross-section at a magnification of 10000, no bubbles were found in the filling layer 13 and the adhesive layer 14.

Examples 3 to 5

As EXAMPLE 3, the composite substrate 10 was fabricated in a similar manner to that in EXAMPLE 2 except for using borosilicate glass as the material of the support substrate 12 prepared in the step (a). As EXAMPLE 4, the composite substrate 10 was fabricated in a similar manner to that in EXAMPLE 2 except for using sapphire as the material of the support substrate 12 prepared in the step (a). As EXAMPLE 5, the composite substrate 10 was fabricated in a similar manner to that in EXAMPLE 2 except for using aluminum nitride as the material of the support substrate 12 prepared in the step (a).

As a result of cutting each of the fabricated composite substrates of EXAMPLES 3 to 5 in the stacking direction of the composite substrate and observing its cross-section at a magnification of 10000, no bubbles were found in the filling layer 13 and the adhesive layer 14.

Example 6

As EXAMPLE 6, the composite substrate 10 was fabricated in a similar manner to that in EXAMPLE 2 except for using a 42° Y-cut X-propagation LT substrate with the propagation direction of surface acoustic waves (SAW) being X and the cut angle being set to provide a 42° rotated Y-cut plate, as the piezoelectric substrate 21 prepared in the step (a).

As a result of cutting the fabricated composite substrate of EXAMPLE 6 in the stacking direction of the composite substrate and observing its cross-section at a magnification of 10000, no bubbles were found in the filling layer 13 and the adhesive layer 14.

Comparative Example 1

As COMPARATIVE EXAMPLE 1, a composite substrate was fabricated in a similar manner to that in EXAMPLE 1 except for omitting the application of the filler in the step (b) and the CMP in the step (c). Because the steps (b) and (c) were not performed, the filling layer is not present and the rear surface of the piezoelectric substrate and the surface of the support substrate were directly bonded to each other in the step (d) with the adhesive layer interposed therebetween. As a result of cutting the composite substrate of COMPARATIVE EXAMPLE 1 in the stacking direction of the composite substrate and observing its cross-section at a magnification of 10000, many bubbles were found at the boundary between the adhesive layer and the silicon substrate and inside the adhesive layer, i.e., at the boundary between the adhesive forming the adhesive layer on the LT substrate side and the applied adhesive forming the adhesive layer on the silicon substrate side. Further, many holes were generated in the surface of the silicon substrate, and the LT substrate was partly peeled off due to the presence of those holes. Such a phenomenon was likely attributable to that bubbles were broken when the adhesive layer was thermally cured. Thus, the composite substrate of COMPARATIVE EXAMPLE 1 had quality not suitable for use as a surface acoustic wave device.

Comparative Example 2

An LT substrate similar to that in EXAMPLE 1 except for being mirror-polished at a rear surface thereof to have an arithmetic mean roughness Ra of 10 nm, and a silicon substrate similar to that in EXAMPLE 1 were prepared. Next, an adhesive made of the same material as that of the adhesive layer 14 in EXAMPLE 1 was uniformly applied in a thickness of 4000 Å on each of the rear surface of the LT substrate and a (front) surface of the silicon substrate by using a spin coater. Next, the adhesive-coated rear surface of the LT substrate and the adhesive-coated surface of the silicon substrate were bonded to each other, and a composite substrate was obtained by curing the adhesive with irradiation of an ultraviolet ray of 2000 mJ from the LT substrate side. The front surface of the LT substrate in the thus-fabricated composite substrate was ground and polished such that the thickness of the LT substrate was reduced to 40 μm from an initial value of 250 μm, whereby a composite substrate of COMPARATIVE EXAMPLE 2 was obtained. A thickness of the adhesive layer after being cured (i.e., a distance from the crest portions of minute asperities in the rear surface of the LT substrate to the support substrate) was 0.8 μm. As a result of cutting the composite substrate of COMPARATIVE EXAMPLE 2 in the stacking direction of the composite substrate and observing its cross-section at a magnification of 10000, no bubbles were found in the adhesive layer for the reason that the rear surface of the LT substrate in COMPARATIVE EXAMPLE 2 was mirror-polished unlike EXAMPLE 1 and COMPARATIVE EXAMPLE 1.

[Evaluation Test 1]

The adhesion strength between the LT substrate and the silicon substrate was compared for the composite substrate 10 of EXAMPLE 1 and the composite substrate of COMPARATIVE EXAMPLE 1. First, a chip having a vertical length of 1 mm and a horizontal length of 2 mm was cut out from each of the composite substrates of EXAMPLE 1 and COMPARATIVE EXAMPLE 1 by dicing. A shearing test was then performed on the cut-out chip. For the chip cut out from the composite substrate of EXAMPLE 1, it was confirmed with the shearing test that the adhesive layer 14 and the filling layer 13 were not peeled off, that the silicon substrate was cracked, and that the adhesion strength between the LT substrate and the silicon substrate was sufficient. On the other hand, for the chip cut out from the composite substrate of COMPARATIVE EXAMPLE 1, peeling-off occurred at the boundary between the adhesive layer and the LT substrate in the shearing test.

As with the composite substrates of EXAMPLE 1 and COMPARATIVE EXAMPLE 1, the adhesion strength between the LT substrate and the support substrate 12 was evaluated for the composite substrates 10 of EXAMPLES 2 to 6. First, a chip having a vertical length of 1 mm and a horizontal length of 2 mm was cut out from each of the composite substrates of EXAMPLES 2 to 6 by dicing. A shearing test was then performed on the cut-out chip. For the chips cut out from the composite substrates of EXAMPLES 2, 3 and 6, the adhesive layer 14 and the filling layer 13 were not peeled off and the support substrate was cracked in the shearing test. For the chips cut out from the composite substrates of EXAMPLES 4 and 5, the adhesive layer 14 and the filling layer 13 were not peeled off and the LT substrate was cracked in the shearing test. From the test results of EXAMPLES 2 to 6, it was confirmed that the adhesion strength between the LT substrate and the support substrate was sufficient as in EXAMPLE 1 even when the filling layer and the adhesive layer were made of different materials. From the test results of EXAMPLES 3 to 5, it was confirmed that the adhesion strength between the LT substrate and the support substrate was sufficient as in EXAMPLE 1 even when the support substrate was made of different materials from that of EXAMPLE 1. Further, from the test result of EXAMPLE 6, it was confirmed that the adhesion strength between the LT substrate and the support substrate was sufficient as in EXAMPLE 1 even when the cut angle of the LT substrate was set to a different value from that in EXAMPLE 1. The reason why, in EXAMPLES 4 and 5, the LT substrate was cracked unlike EXAMPLE 1 resides likely in that the support substrates used in EXAMPLES 4 and 5 were made of materials having higher strength than the LT substrate.

[Evaluation Test 2]

A surface acoustic wave device was fabricated from each of the composite substrates 10 of EXAMPLES 1, 2 and 6 and the composite substrate of COMPARATIVE EXAMPLE 2, and measurement was performed for changes in dimensions of the piezoelectric substrate depending on temperature changes, i.e., for a temperature coefficient of frequency (TCF) and the occurrence of the spurious.

Figure 3:
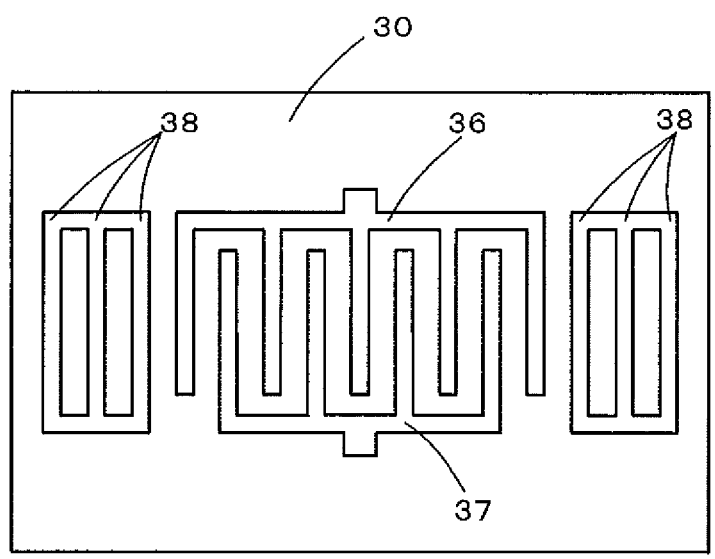
FIG. 3 is a plan view of a surface acoustic wave device of EXAMPLE 1 and COMPARATIVE EXAMPLE 2.

The surface acoustic wave device was fabricated as follow. First, plural sets of comb-shaped electrodes each made of aluminum and having a thickness of 0.12 μm and a period of 6 μm were formed on the front surface of the LT substrate by using ordinary photolithography in such a shape that the finally fabricated surface acoustic wave device was able to function as a 1-port SAW resonator with a center frequency of 720 MHz at normal temperature. For each set of the comb-shaped electrodes, two reflectors were formed in sandwiching relation to the comb-shaped electrodes. The LT substrate was then cut into shapes corresponding to individual surface acoustic wave devices by dicing. Each of the cut surface acoustic wave devices had a vertical length of 1 mm and a horizontal length of 2 mm. A plan view of the surface acoustic wave device thus obtained is illustrated in FIG. 3. FIG. 3 is the plan view, when looking at the obtained surface acoustic wave device from the front surface side of the LT substrate. The obtained surface acoustic wave device includes, as illustrated in FIG. 3, comb-shaped electrodes 36 and 37 and reflectors 38 on a front surface 30 of the LT substrate.

The temperature coefficient of frequency (TCF) and the occurrence of the spurious were measured for the surface acoustic wave devices of EXAMPLES 1, 2 and 6 and COMPARATIVE EXAMPLE 2. The measured temperature coefficient of frequency was −27.0 ppm/K in the surface acoustic wave device of EXAMPLE 1, −27.0 ppm/K in the surface acoustic wave device of EXAMPLE 2, −26.3 ppm/K in the surface acoustic wave device of EXAMPLE 6, and −26.0 ppm/K in the surface acoustic wave device of COMPARATIVE EXAMPLE 2. Also, as a result of measuring the temperature coefficient of frequency for another surface acoustic wave device cut out from the composite substrate of EXAMPLE 1, −26.5 ppm/K was obtained. Further, the temperature coefficient of frequency in a surface acoustic wave device, which was fabricated by providing the comb-shaped electrodes on the LT substrate without using the silicon substrate, was −40.0 ppm/K. Regarding the occurrence of the spurious, a ripple measured in a higher frequency range than the resonance frequency was 1 dB in each of the surface acoustic wave devices of EXAMPLES 1, 2 and 6, and a ripple measured in the higher frequency range than the resonance frequency was 4 dB in the surface acoustic wave device of COMPARATIVE EXAMPLE 2.

From the above-described results, it was confirmed that, in the composite substrate of EXAMPLE 1, a smaller ripple was generated, namely the occurrence of the spurious was suppressed, and a temperature coefficient of frequency comparable to that in COMPARATIVE EXAMPLE 2 was obtained because the rear surface of the LT substrate was rougher in the composite substrate of EXAMPLE 1 than in that of COMPARATIVE EXAMPLE 2. From the results measured for EXAMPLES 2 and 6, it was confirmed that, even when the filling layer and the adhesive layer were made of different materials, the occurrence of the spurious was suppressed as in EXAMPLE 1, and a temperature coefficient of frequency comparable to that in COMPARATIVE EXAMPLE 2 was obtained. From the results measured for EXAMPLE 6, it was confirmed that, even when the cut angle of the LT substrate was set to a value differing from that in EXAMPLE 1, the occurrence of the spurious was suppressed as in EXAMPLE 1, and a temperature coefficient of frequency comparable to that in COMPARATIVE EXAMPLE 2 was obtained. Further, comparing with COMPARATIVE EXAMPLE 1 in which the rear surface of the LT substrate was roughed as in EXAMPLES 1 to 6, it was confirmed for each of the composite substrates of EXAMPLES 1 to 6 that no bubbles were present in the filling layer and the adhesive layer, and that the adhesion strength between the LT substrate and the support substrate was higher.

The present application claims priority on the basis of the U.S. Provisional Patent Application No. 61/390,240 filed on Oct. 6, 2010, the entire contents of which are incorporated herein by reference.

What is claimed is:

1. A composite substrate comprising:
   a piezoelectric substrate having asperities formed in one surface thereof;
   a support substrate having a smaller thermal expansion coefficient than the piezoelectric substrate;
   a filling layer formed to fill the asperities and having a joined surface on the side oppositely away from the piezoelectric substrate, the joined surface having an arithmetic mean roughness Ra smaller than an arithmetic mean roughness Ra of the one surface of the piezoelectric substrate; and
   an adhesive layer bonding the joined surface and the support substrate to each other,
   wherein a first boundary exists between the adhesive layer and the filling layer, and no bubbles are present at the first boundary between the adhesive layer and the filling layer, inside the adhesive layer, and at a second boundary between the adhesive layer and the support substrate.

2. The composite substrate according to claim 1, wherein the one surface of the piezoelectric substrate is partly exposed to the joined surface.

3. The composite substrate according to claim 1, wherein the adhesive layer is made of the same material as that of the filling layer.

4. A method for manufacturing the composite substrate according to claim 1, comprising the steps of:
   (a) preparing the piezoelectric substrate having asperities formed in one surface thereof, and the support substrate having a smaller thermal expansion coefficient than the piezoelectric substrate;
   (b) applying a filler to the one surface to fill the asperities, thereby forming the filling layer;
   (c) mirror-polishing a surface of the filling layer to such an extent that an arithmetic mean roughness Ra of the surface of the filling layer is smaller than the arithmetic mean roughness Ra of the one surface in the step (a); and
   (d) bonding the surface of the filling layer and a surface of the support substrate to each other with the adhesive layer interposed therebetween, thereby forming the composite substrate.

5. The composite substrate manufacturing method according to claim 4, wherein, in the step (c), the surface of the filling layer is mirror-polished by using slurry which exhibits a lower polishing rate for the piezoelectric substrate than that for the filling layer.

6. The composite substrate manufacturing method according to claim 4, wherein, in the step (c), the minor-polishing is performed until the one surface of the piezoelectric substrate is partly exposed.

7. The composite substrate manufacturing method according to claim 4, wherein, in the step (d), the bonding is performed with interposition of the adhesive layer, which is made of the same material as that of the filling layer formed in the step (b).

* * * * *